United States Patent [19]

Gutterman

[11] 4,016,428
[45] Apr. 5, 1977

[54] POWER SWITCHING CIRCUIT

[75] Inventor: Eric D. Gutterman, Granada Hills, Calif.

[73] Assignee: Allan S. Beck, Granada Hills, Calif.

[22] Filed: Nov. 13, 1975

[21] Appl. No.: 631,438

[52] U.S. Cl. .......................... 307/116; 340/258 B; 340/279; 307/308; 328/5; 361/89

[51] Int. Cl.² ...................................... H03K 17/00

[58] Field of Search .......... 307/116, 117, 118, 308, 307/248, 253; 317/DIG. 2; 340/258 R, 258 A, 258 B, 258 C, 279; 328/5

[56] References Cited

UNITED STATES PATENTS

| | | | |
|---|---|---|---|
| 3,144,592 | 8/1964 | Leeds et al. | 317/DIG. 2 |
| 3,177,481 | 4/1965 | Joy et al. | 340/279 |
| 3,736,445 | 5/1973 | Van Sickle | 307/308 |

*Primary Examiner*—Herman J. Hohauser

[57] ABSTRACT

An automatic power switching circuit for controlling the application of electrical power to an electric typewriter or like apparatus. Radiated electrical energy emanating from alternating current machinery is transmitted to an input antenna by the touch of the operator. The input alternating current signal is shaped to produce electrical signal indicia responsive to the operator's contact with the apparatus. The input signal is transmitted to a timing circuit to initiate the time-out of predetermined delay following which an output signal will be generated and the apparatus will be disconnected from the power source in the absence of human contact during the delay interval.

10 Claims, 3 Drawing Figures

POWER SWITCHING CIRCUIT

BACKGROUND OF THE INVENTION

1. Field of the Invention

The present invention generally relates to power switching circuits and, more particularly, to those circuits used to disconnect power from an appliance following the expiration of predetermined interval of disuse.

2. Prior Art

With the increased need to conserve energy and to eliminate the unwarranted expenditures arising out of damage to equipment from applying power thereto during periods of disuse, it has become evident that means are necessary to improve present procedures and apparatus. The prior art discloses a number of devices which are used to switch or otherwise apply power to and remove power from electrical appliances such as electric typewriters. In substantially all of the devices disclosed by the prior art, the means used to switch power to and from the apparatus employs either mechanical, electromechanical or thermal elements. One of the devices disclosed by the prior art is specifically incorporated into a typewriter. A thermal cut-out switch is used for controlling the power delivered to a driving motor of the electric typewriter. A heater comprising a coil of resistant wire heats a bimetallic member causing it to bow in a specified direction. When the operator of the typewriter turns power to the on position, the heater will be periodically impulsed with current with the result that it will cause the bimetallic member to bow in the predetermined direction. Therefore, as long as the operator is using the machine, the heater will be kept hot enough to prevent the bimetallic member from being deflected in the opposite direction and thereby causing the motor to be disconnected from the circuit. Once the operator leaves the machine unattended, the heater will cool thereby disconnecting the power to the typewriter.

A mechanical cut-off device described by the prior art is pivotally supported on a typewriter for engagement with a continuously driven power roll. A driving wheel, an operating cam and a climbing wheel are coaxially mounted in a bracket for engagement with the continuously operated power roll. If the machine is left unattended for a predetermined period, the climbing wheel will frictionally engage the operating cam which will act to cut off the power to the electric motor. The climbing wheel is resettable to its quiescent position upon operation of selected ones of the functioning elements of the typewriter.

All of the devices disclosed by the prior art have a number of inherent difficulties which are common irrespective of whether the devices utilize mechanical, electromechanical or thermal principles for their operation. In all cases, the devices are integrally coupled to the specific machine with which they are used, and in all cases described, the switching or cut-off device is used with a typewriter. Although the present invention is preferably utilized with a typewriter, it is clear that the present invention can be used with any appliance or machine which utilizes intermittent operator contact.

The present invention employs an electrically conductive antenna which receives an input signal derived from the energy radiated from alternating current machinery within the vicinity of the appliance. When the operator touches the input antenna, the ambient electrical signal is applied to the input of the present invention circuit. The input signal is shaped into electrical signals which can be used to trigger a timing element. An alternating current switch controls the delivery of power to the typewriter or other suitable appliance. So long as the operator makes contact with the input antenna, the timing elements will continue to be reset thereby reinitiating any time-out sequence thereof. After the operator discontinues use of the machine to which the present invention is coupled, the timing element will continue to provide an electrical signal responsive to its status, the signal preventing the alternating current switch from disconnecting the power to the machine. After the time-out of a predetermined interval, the alternating current switch will be shut off and power will be removed from the machine. In order to restart the appliance, the operator need merely make contact with the input antenna which will result in activation of the alternating current switch and thereby restore power to the typewriter or other appliance being utilized.

SUMMARY OF THE INVENTION

The present invention power disconnecting circuit provides for means to automatically disconnect an appliance from its source of power after the expiration of a predetermined interval during which the appliance has not been used. Although it is clear to one having skill in the art that the present invention circuit can be used with virtually any type of appliance or machine which is intermittently used by an operator, the circuit will be described in connection with an electric typewriter, the selection of an electric typewriter being for the purpose of example only.

Electrical energy radiated from alternating current sources provide the source of input signals to the present invention circuit. An electrically conductive antenna comprises the input element of the present invention circuit. When touched by an operator, the ambient electrical energy provides for an input, alternating current signal which is used to activate the circuit. The alternating current input signal is properly conditioned to provide for appropriate sequencing and timing requirements. The conditioned signal is input to a timing circuit which provides for electrical translation of the input signal. The timing circuit provides for the generation of electrical indicia responsive to the passage of a predetermined interval of time. If at any time during the timing sequence the operator should recontact the input antenna, the timer will restart the timing sequence. So long as the timing circuit does not reach the termination of its counting sequence, a quiescent signal level will be output from the timing circuit and provide for appropriate indicia to maintain power to the driving motor of the electric typewriter. The output of the timing circuit is isolated from an alternating current switch which is interposed in the lines between the alternating current power source and the electric typewriter. If the operator fails to contact the input antenna prior to the expiration of the timing interval, the output level from the timing circuit will change to an appropriate level sufficient to shut off the switch transmitting power to the electric typewriter. In this manner, the electric typewriter, or any other suitable appliance, will be shut off automatically if use thereof has been discontinued for the predetermined interval of time.

It is therefore an object of the present invention to provide an improved power switching circuit for electrical appliances.

It is another object of the present invention to provide a power switching circuit which is automatically resettable as a function of operator use.

It is yet another object of the present invention to provide an automatic power switching circuit which utilizes ambient electrical energy as the source of the input signal thereto.

It is still yet another object of the present invention to provide a power switching circuit which is inexpensive and simple to fabricate.

The novel features which are believed to be characteristic of the invention, both as to its organization and method of operation, together with further objectives and advantages thereof, will be better understood from the following description considered in connection with the accompanying drawing in which a presently preferred embodiment of the invention is illustrated by way of example. It is to be expressly understood, however, that the drawing is for the purpose of illustration and description only and is not intended as a definition of the limits of the invention.

DESCRIPTION OF THE PRESENTLY PREFERRED EMBODIMENT

Figure 1:
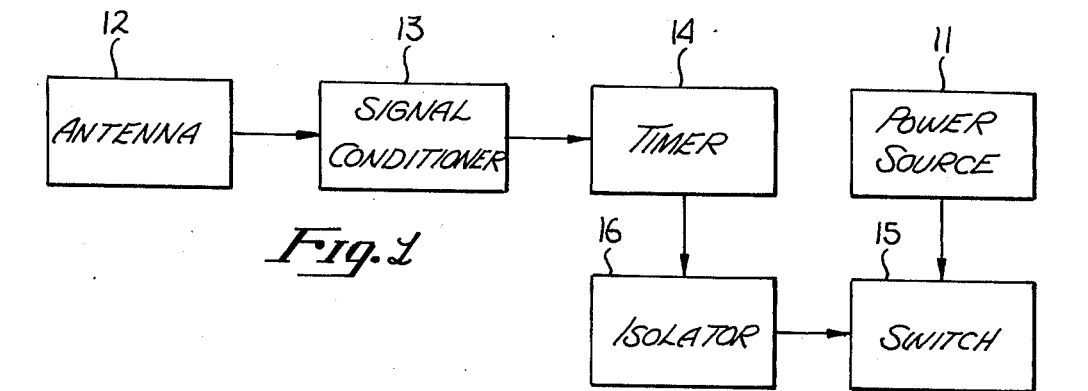
FIG. 1 illustrates a schematic diagram, in block form, of a power switching circuit in accordance with the present invention.

An understanding of the present invention can be best gained by reference to FIG. 1 wherein a schematic diagram, in block form, illustrates the elements of the present invention power switching circuit being utilized in appliance 10. As set forth hereinabove, the present invention power switching circuit can be used with substantially all appliances or machines which have intermittent operator contact. For the purpose of example only, the present invention circuit will be described in connection with an electric typewriter. Typewriter 10 is typically driven by an internal motor which is typically powered by 115 volts, 60 Hertz power. As shown in FIG. 1, power source 11 represents the motive force for typewriter 10 and in the case of this example, is a source of alternating current power. Although the exemplary material dealing with typewriter 10 utilizes a 115 volt alternating current power, it is clear that the present invention is equally applicable to other machines which utilize levels of alternating current power as well as direct current power.

In any environment where alternating current machinery are present or where alternating current power is being generated, the ambient atmosphere is source of radiated power. Referring now to FIG. 1, antenna 12 provides the input coupling to the present invention circuit. An environment which includes sources of radiated power provides the means for operating the present invention circuit. The operator of typewriter 10 provides the means for supplying an input signal to antenna 12. The human body is electrically conductive but provides a high impedance load to any source of electrical power. In an environment where there is a source of radiating alternating current power, the power will be redirected along the surface of the operator's body and constitute a transmission line for the radiated voltage although it will constitute a substantially zero current source. Where the radiating source is 115 volts, 60 Hertz, the signal which would be applied to antenna 12 by the contact of a human body will be a 60 Hertz signal, the amplitude thereof being approximately in the range of 30 to 100 volts, peak to peak.

The output of antenna 12 is applied to signal conditioning circuit 13 which adapts the radiated input signal for proper operation of the present invention circuit. The output of signal conditioner 13 compises an electrical signal which is appropriate to energize the timing elements used within the present invention circuit. The output of signal conditioner 13 is applied to timer 14. Timer 14 accomplishes one of the objectives of the present invention. As stated previously, the present invention circuit provides for disconnecting typewriter 10 from power source 11 following the expiration of a predetermined interval within which there has been no contact by the operator of antenna 12. Timer 14 is interposed between power source 11 and typewriter 10. Alternating current switch 15 is a suitable circuit which provides for the transmission and interruption of an AC signal from power source 11 to typewriter 10. To appropriately interface timer 14 and switch 15, isolator 16 provides a suitable means for insuring that the output signal of timer 14 will control the operation of AC switch 15. Through the use of a circuit in accordance with the schematic shown in FIG. 1, the ambient energy existing in the vicinity of electrical power sources can be applied to antenna 12. Each time the human operator makes contact with antenna 12, timer 14 will be reset to carry out the termination of a preselected interval of time. Where there is no contact with antenna 12 within the interval determined by timer 14, switch 15 will be turned off thereby interrupting the transmission of power from power source 11 to appliance 10. In the event the operator does make contact with antenna 12 during the countdown of the interval determined by timer 14, timer 14 will be reset and will reinitiate the countdown sequence. In this manner, typewriter 10 will be shut off when it is not in use, the indicia of disuse being the absence of operator contact during the countdown of the interval determined by timer 14.

Figure 2:
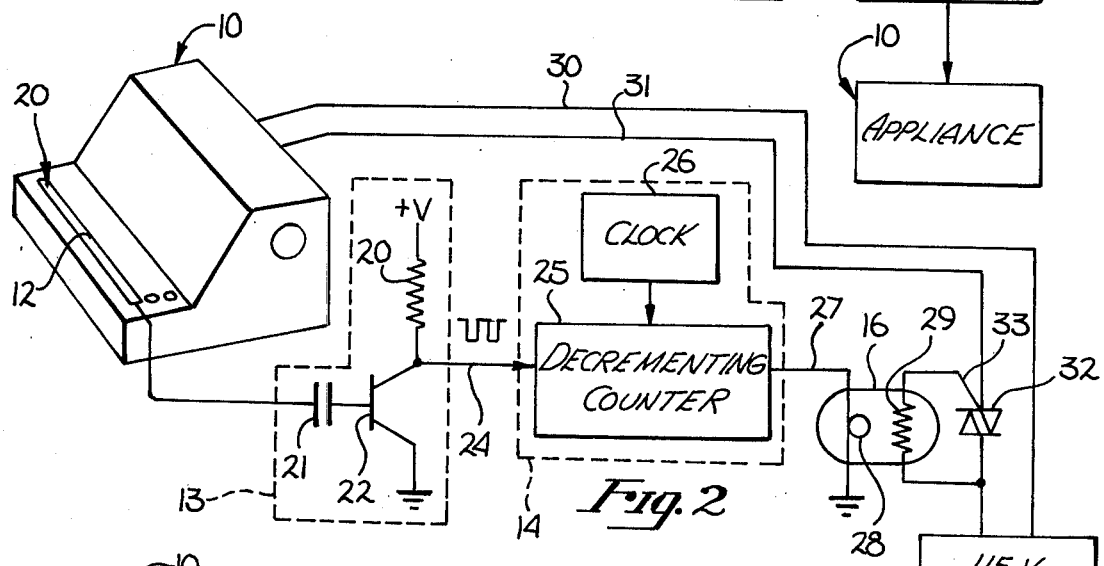
FIG. 2 illustrates a form of an electrical circuit implementing the present invention shown in FIG. 1.

A form of an electrical circuit for implementing the schematic shown in FIG. 1 is illustrated in FIG. 2. Typewriter 10 is depicted pictorially. As stated hereinabove, the ability to appropriately start a countdown of the preselected timing interval is contingent upon contact by the human operator. In this case, an appropriate functional key of typewriter 10 is selected to act as the source of operator contact. As shown in FIG. 2, space bar 20 is a suitable receiver for indicia of operator contact because of its frequent use, but it is clear that any other suitable functional element of typewriter 10 could be used. Antenna 12 is disposed upon space bar 20 to act as the receiver of any signal which is input as a result of operator contact with space bar 20. Antenna 12 comprises an electrically conductive layer which can typically be secured to the top of space bar 20 in a manner which will not interfere with the appropriate operation of space bar 20. By using an electrically conductive element to implement antenna 12, human contact with space bar 20 will provide for the input of a signal which is derived from the energy which has been radiated through the environment within which typewriter 10 is disposed. An adhesively affixed, metallic member is suitable for fabricating antenna 12. The signal input to antenna 12 is transmitted through capacitor 21 which provides for AC coupling to the signal shaping stage of the present invention. Capacitor 21 is connected to the base of NPN transistor 22, the collector of transistor 22 being coupled to a positive voltage source through resistor 23, the emitter of transmitter 22 being connected to a source of ground potential. Transistor 22 comprises a conventional amplifier stage which will be driven alternately between states of saturation and cut-off. As a result, the output of transistor 22 will appear at the collector thereof, and be a square wave which has pictorially been illustrated appearing on output line 24.

The signal appearing on output line 24 drives decrementing counter 25. In the form of the present invention shown in FIG. 2, a conventional decrementing counter 25 can be employed. Although the manner of implementing decrementing counter 25 is well known to those having skill in the art, a typical implementation could utilize a read-only memory which will store an appropriate start count and a set of decrementing flip-flops which will count from the value stored in the read-only memory to zero upon initiation from the signal appearing on line 24. The continuing clock pulses derived from clock 26 will serve to drive the elements of counter 25. When implemented in this manner, the output of transistor 22 can easily be used to reset the value of the decrementing counter 25 back to the initial value as set forth in the read-only memory. In this manner, the primary objective of the present invention is accomplished. Since conventional flip-flop counters provide for a single output which can remain at a logically true level until the counter is fully decremented to zero, or any other appropriate value, the output of decrementing counter 25 appears on line 27 and is input to isolation circuit 16. The form of the present invention shown in FIG. 2 utilizes a light dependent resistor/lamp assembly to comprise the implementation of isolator 16. Light dependent resistor/lamp assembly 16 is a known device which exhibits electrical characteristics which are appropriate for implementing the isolation element. So long as the output signal derived from decrementing counter 25 appearing on line 27 is sufficient to drive lamp 28, the value of light dependent resistance 29 remains low and approaches zero. Although a preferred form of the present invention utilizes a light dependent resistor/lamp assembly to implement isolator 16, it is clear that an electromechanical relay or other suitable switching device can be used in place thereof.

Power source 11 comprises a conventional source of 115 volts, 60 Hertz power. As shown in FIG. 2, a first power lead 30 is directly connected from typewriter 10 to power source 11, the second power lead 31 having triac 32 interposed therein between typewriter 10 and power source 11. Triac 32 is a conventional AC switching device which comprises a silicon controlled rectifier. The anode and cathode of triac 32 are appropriately connected to typewriter 10 and power source 11 respectively, light dependent resistance 29 being coupled intermediate gate 33 and the anode of triac 32. When the output of decrementing counter 25 presents a level on line 27 which drives lamp 28, the resistance of light dependent resistor 29 decreases turning triac 32 on. If the value of decrementing counter 25 reaches zero prior to reinitiation, the output level appearing on line 27 will typically result in lamp assembly 28 being shut off with the resulting resistance of light dependent resistor 29 increasing. By increasing the resistance in light dependent resistor 29, gate 33 will be caused to shut off the transmission of power through triac 32.

Figure 3:
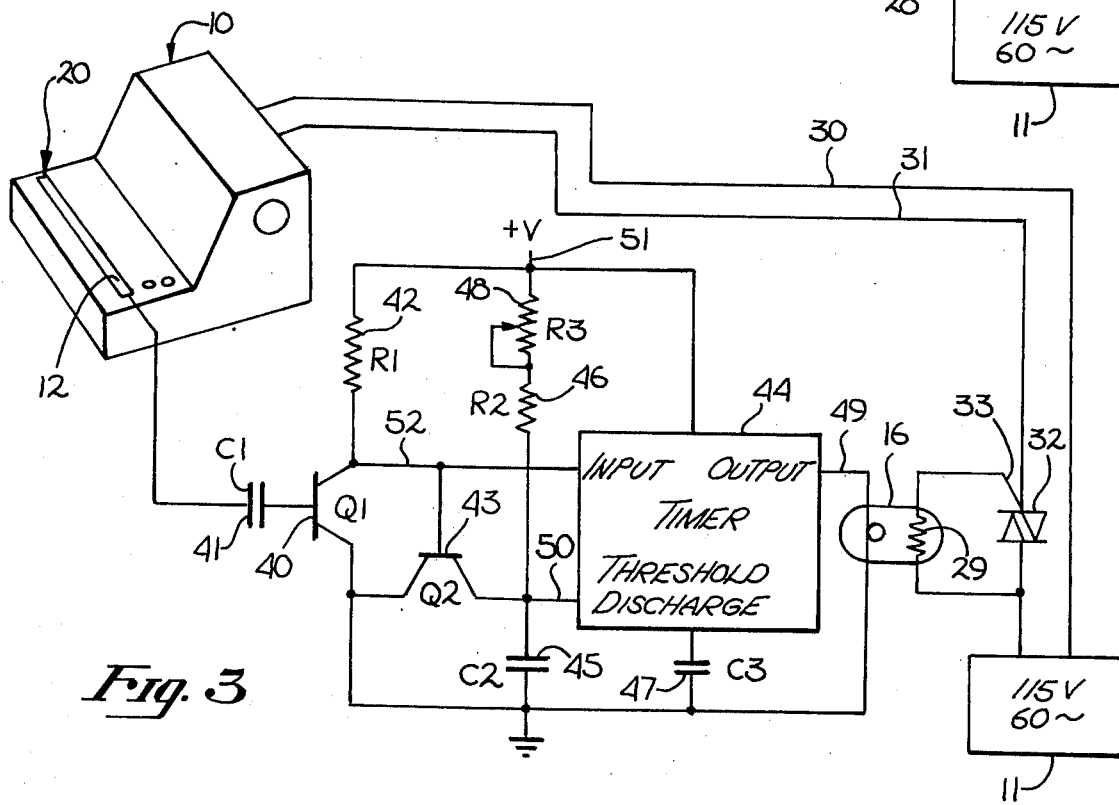
FIG. 3 illustrates an electrical circuit comprising a preferred form of the present invention shown in FIG. 1.

Referring now to FIG. 3, a preferred form of the present invention power disconnect circuit can be best seen. As stated hereinabove, the use of the space bar 20 of typewriter 10 is a suitable key to provide for the receipt of indicia of repetitive use of the machine. Antenna 12 is coupled to space bar 20 and, as stated hereinabove, typically comprises an electrically conductive member which is appropriate to transmit the low current, AC voltage signals applied through contact by the operator. Antenna 12 is AC coupled to transistor 40 by capacitor 41. The collector of transistor 40 is connected to a source of positive voltage through resistor 42 which comprises the load resistor for transistor 40. The collector of transistor 40 is connected to the collector of transistor 43 and is tied directly to a point of ground potential. The emitter of transistor 43 is connected to one terminal of capacitor 45 as well as to resistor 46 and the threshold and discharge terminals of timing circuit 44. The second terminal of capacitor 45 is connected to a voltage of ground potential. Capacitor 47 is coupled intermediate a voltage control input of timing circuit 44 and a point of ground potential to hold the circuit at AC ground. In order to permit the timing interval established by timing circuit 44 to be variable, resistor 46 is coupled to a positive voltage source through resistor 48. The output of timing circuit 44 appears on line 49, output 49 being coupled to lamp assembly 28 of isolator 16. As stated hereinabove, a preferred form of the present invention utilizes a light dependent resistor/lamp assembly to implement isolator 16 and, therefore, light dependent resistor 29 is coupled across gate 33 and the anode of triac 32. As in the case of the form of the present invention shown in FIG. 2, line 30 is coupled directly intermediate the power source integral with typewriter 10 and power source 11, the second line 31 having triac 32 disposed intermediate typewriter 10 and power source 11.

In the preferred form of the present invention shown in FIG. 3, timing circuit 44 comprises a timing circuit which is commerically manufactured under the designation shown in Table 1.

TABLE 1

| Reference Numeral | Component | Value |
|---|---|---|
| 40 | ransistor Q1 | 2N5089 |
| 43 | Transistor Q2 | 2N3906 |
| 44 | Timer | LM555CM |
| 42 | Resistor R1 | 100K, .25W |
| 46 | Resistor R2 | 1K, .25W |
| 48 | Resistor R3 | 1M, .25W |
| 41 | Capacitor C1 | .01μf, 100V |
| 45 | Capacitor C2 | 47μf, 30V |
| 47 | Capacitor C3 | .01μf, 100V |
| 16 | Isolator | Optoisolator 301T1-12B1 |
| 32 | Triac | SC146B |

The timing circuit 44 digitally detects a signal which appears on line 50 and is one which exponentially rises from ground to the value of the positive voltage source appearing on line 51. The period of the signal appearing on line 50 is a result of the value of capacitor 45 and resistances 46 and 48. When capacitor 45 has charged to a level which is in the range of ⅓ to ⅔ of the maximum value defined by the voltage source appearing on line 51, timer 44 will be discharged causing the signal on line 50 to drop to ground potential and causing the output signal appearing on line 49 to drop to a ground potential.

As stated hereinabove, the radiated energy transmitted to antenna 12 via the human operator is typically a 60 Hertz signal having a peak to peak value of approximately 30 to 100 volts. Capacitor 41 couples the signal to the base of transistor 40. The output of transistor 40 appears at the collector thereof and on line 52 and is schematically illustrated as a square wave. The square wave appearing on line 52 is a result of driving transistor 40 between the states of saturation and cut-off. The input signal appearing on line 52 is transmitted to the input of timing circuit 44, the swing from positive to negative typically initiates the comparison process of timing circuit 44 which would appear at the threshold lead designated by the reference numeral 50. Where capacitor 45 and resistors 46 and 48 have the values illustrated in Table 1, the charging cycle will be determined by the time constant of those component values. Since resistor 48 is variable, the charging time constant can be altered to change the timing interval to suit the purposes of the operator. While capacitor 45 is charging, and prior to any reuse of typewriter 10 by the operator, the output of timing circuit 44 appearing on line 49 will be logically true thereby driving lamp assembly 28.

As stated hereinabove, one of the objects of the present invention is to provide for a recycling of timing circuit 44 when the operator makes contact with the antenna 12 during the timing cycle. Capacitor 45 will be charged from ground to the value of the positive voltage level appearing on line 51 based upon the values of capacitor 45 and resistors 46 and 48. If the operator contacts space bar 20 during the charging cycle, the square wave appearing on line 51 will drive transistor 43 into saturation thereby discharging capacitor 45 to ground restarting the threshold indicia element. As a result, the threshold circuit will be caused to recharge capacitor 45 from ground potential and will thereby cause a reinitiation of the timing cycle. So long as the operator makes additional contact with antenna 12 during the timing interval, capacitor 45 will be continuously discharged thereby restarting the charging cycle. As a result, the timing interval determined by capacitor 45 and resistors 46 and 48 will not have an opportunity to fully charge and therefore timing circuit 44 will not reach the terminus of the timing interval. So long as the terminus of the timing interval is not detected by the comparator element of timer 44, the electrical signal appearing on line 49 will continue to drive line element 28 and maintain the value of light dependent resistance 29 at a negligible level. So long as gate 33 is coupled to the anode of triac 32 through light dependent resistance 29, power source 11 will be coupled to the motor of typewriter 10 and operation of typewriter 10 will continue. If the operator of typewriter 10 fails to make contact with antenna 12 during the charging of capacitor 45, and if the timing interval is sufficient to permit the comparator to detect the level which lies in the interval of ⅓ to ⅔ of the full voltage level appearing on line 51, timing circuit 44 will time out thereby driving the value of the signal on line 49 to ground and shutting off light assembly 28. When light assembly 28 is shut off, the resistance of light dependent resistance 29 will increase causing triac 32 to disconnect power source 11 from typewriter 10.

The present invention power switching circuit provides means to insure that an electrical appliance will not remain connected to a source of power after the termination of a specified interval within which it has not been used. Since the operator will only touch the antenna of the present invention to start the appliance, it is clear that use of the present invention power switching circuit will protect the motor or other vital elements of the appliance. By providing the ability to vary the timing interval, substantially all appliances which utilize intermittent operator use can employ the present invention circuit. Through the use of the present invention power switching circuit, the appliance will automatically be disconnected and shut down if the operator does not reuse the device during the pre-established interval. In addition, reinitiation of use by the operator will occur merely by contacting the input antenna thereby simplifing use of the appliance while protecting the elements thereof. Although it is clear that only a few embodiments of the invention have been illustrated and described, it will be apparent by those having skill in the art the various modifications that may be made therein without departing from the scope of the present invention.

I claim:

1. A power switching circuit for use with electrical appliances driveable by a power source comprising:
   a. input signal means for receiving signal indicia representative of appliance operation;
   b. timing means for initiating the time out of a predetermined interval, said time out commencing upon each signal indicia received by said input signal means, said timing means being coupled to said input signal means, said timing means outputting a signal responsive to said interval, said output signal being in a first state during said interval and changing to a second state following the termination of said interval;
   c. a power switch connected to the electrical appliance, said power switch including control means for connecting and disconnecting the electrical appliance from the power source; and
   d. isolation means for coupling the output signal of said timing means and the control means of said power switch whereby said control means disconnects the electrical appliance from the power source when the output signal of said timing means is in the second state thereof.

2. A power switching circuit as defined in claim 1 wherein said isolation means comprises a light dependent resistance and lamp assembly including a light emitting member and a light dependent resistive member, said light emitting member being connected to the output of said timing means, said light dependent resistive member being connected to the control means of said power switch.

3. A power switching circuit as defined in claim 1 wherein said input signal means includes an antenna comprising an electrically conductive member.

4. A power switching circuit as defined in claim 3 further including a power source, a first electrical translating element having at least three active regions, the first active region of said first electrical translating element being connected to said antenna, the second active region of said first electrical translating element being connected to a first pole of said power source, and the third active region of said first electrical translating element being coupled to the second pole of said power source and to the input of said timing means whereby signal indicia received by said antenna are transmitted to said timing means.

5. A power switching circuit as defined in claim 4 wherein said timing means includes threshold means for detecting a threshold signal, and further including a second electrical translating element having at least three active regions, the first active region of said second electrical translating element being connected to the second active region of said first electrical translating element, the second active region of said second electrical translating element being connected to the third active region of said first electrical translating element, and the third active region of said second electrical translating element being coupled to the threshold means of said timing means, a resistive member connected intermediate the third active region of said second electrical translating element and the first pole of said power source, and a capacitive member being connected intermediate the third active region of said second electrical translating element and the second pole of said power source whereby said resistive and capacitive members determine the threshold signal.

6. A power switching circuit as defined in claim 5 wherein said resistive member is a variable resistor.

7. A power switching circuit for use with electrical appliances driveable by a power source comprising:
 a. an input antenna;
 b. a first electrical translating member having base, collector and emitter regions, the base region of said first electrical translating member coupled to said input antenna;
 c. a second electrical translating member having base, collector and emitter regions, the base and collector of said second electrical transmitting member being connected to the collector and emitter respectively of said first electrical translating member;
 d. timing means for initiating the time-out of a predetermined interval, said time-out commencing upon the receipt of signal indicia by said input antenna, said timing means including threshold and discharge means for generating and detecting a threshold signal, said timing means producing an output signal responsive to the detection of said threshold signal, said timing means being coupled to the collector of said first electrical translating member, said threshold and discharge means being coupled to the emitter of said second electrical translating member;
 e. charging means for controlling the rate of charging of said threshold signal, said charging means being connected to said threshold;
 f. a power switch connected to the electrical appliance, said power switch including control means for connecting and disconnecting the electrical appliance from the power source; and
 g. isolation means for coupling the output signal of said timing means and the control means of said power switch whereby said control means disconnects the electrical appliance from the power source when the output signal of said timing means is responsive to the discharge of said threshold signal.

8. A power switching circuit as defined in claim 7 wherein said isolation means comprises a light dependent resistive and lamp assembly including a light emitting member and a light dependent resistive member, said light emitting member being connected to the output of said timing means, said light dependent resistive member being connected to the control means of said power source.

9. A power switching circuit as defined in claim 7 wherein said charging means comprises a direct current power source having first and second poles of opposite polarity, a capacitive member connected intermediate the emitter of said second electrical translating member and the first pole of said power source, and a resistive member being connected intermediate the emitter of said second translating member and the second pole of said power source.

10. A power switching circuit as defined in claim 9 wherein said resistive member is a variable resistor.

* * * * *